United States Patent
Hsu et al.

(10) Patent No.: US 7,656,040 B2
(45) Date of Patent: Feb. 2, 2010

(54) STACK STRUCTURE OF CIRCUIT BOARD WITH SEMICONDUCTOR COMPONENT EMBEDDED THEREIN

(75) Inventors: Shih-Ping Hsu, Hsin-chu (TW); Chung-Cheng Lien, Hsin-chu (TW); Chia-Wei Chang, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 160 days.

(21) Appl. No.: 11/756,403

(22) Filed: May 31, 2007

(65) Prior Publication Data
US 2007/0278644 A1  Dec. 6, 2007

(30) Foreign Application Priority Data
Jun. 1, 2006  (TW) ............................. 95119330 A

(51) Int. Cl.
H01L 23/02 (2006.01)
H01L 23/48 (2006.01)
H01L 23/52 (2006.01)
H01L 29/40 (2006.01)

(52) U.S. Cl. ...................... 257/777; 257/686

(58) Field of Classification Search ............. 361/735, 361/760, 764; 257/732, 777–778, 738, 285–686, 257/E23.085
See application file for complete search history.

(56) References Cited

U.S. PATENT DOCUMENTS 5,323,060 A    6/1994  Fogal et al.
6,020,629 A *  2/2000  Farnworth et al. .......... 257/686

* cited by examiner

*Primary Examiner*—Cuong Q Nguyen
(74) *Attorney, Agent, or Firm*—Sawyer Law Group, P.C.

(57) ABSTRACT

A stack structure of circuit boards embedded with semiconductor components therein is proposed, which includes at least two semiconductor components embedded circuit boards, a plurality of conductive bumps, and at least one adhesive layer. The circuit boards are each formed with a circuit layer having a plurality of electrical connection pads. The conductive bumps are formed on the electrical connection pads of at least one of the circuit boards. The adhesive layer is formed between the circuit boards such that a portion of the adhesive layer between the conductive bumps and the electrical connection pads, or between the opposing conductive bumps, forms a conductive channel and thereby forms an electrical connection between the circuit boards.

16 Claims, 5 Drawing Sheets

STACK STRUCTURE OF CIRCUIT BOARD WITH SEMICONDUCTOR COMPONENT EMBEDDED THEREIN

BACKGROUND OF THE INVENTION

1. Field of the Invention

The present invention relates to stack structures of circuit boards, and more particularly, to a stack structure of circuit boards each embedded with a semiconductor component.

2. Description of the Prior Art

Electronic products nowadays have a trend toward minimization. With the sizes of electronic products decreasing, there is a need to embed, more densely than before, semiconductor components with various functions in a circuit board. To meet the need, manufacturers mount at least two semiconductor chips on a chip carrier (a substrate or leadframe, for example) of a single package, upwardly stack the semiconductor chips one by one on the chip carrier, and then perform wire bonding to achieve electrical connection.

Referring to FIG. 1, it shows a cross-sectional view illustrating a multi-chip semiconductor package 1 disclosed in U.S. Pat. No. 5,323,060. The semiconductor package 1 comprises a first semiconductor chip 12a mounted on a circuit board 11. The first semiconductor chip 12a is electrically connected to the circuit board 11 by a plurality of first bonding wires 13a. Disposed on the first semiconductor chip 12a in a stacking manner is a second semiconductor chip 12b, with an adhesive layer 14 applied therebetween. The adhesive layer 14 is typically one of an epoxy resin adhesive and an adhesive tape. Afterward, the second semiconductor chip 12b is electrically connected to the circuit board 11 by a plurality of second bonding wires 13b. However, the wire bonding process for the first semiconductor chip 12a has to be performed before the second semiconductor chip 12b. In other words, both die bonding and wire bonding have to be carried out to the chips one by one and level by level, thus making the process complex. In addition, considering that the first semiconductor chip 12a, the adhesive layer 14, and the second semiconductor chip 12b are in turn carried on the circuit board 11, and that it is necessary to prevent the second semiconductor chip 12b from coming into contact with the first bonding wires 13a, the adhesive layer 14 has to have a thickness sufficient to allow the second semiconductor chip 12b to be higher than the loop height of the first bonding wires 13a. In consequence, the overall thickness of the semiconductor package 1 turns out to be against the trend of miniaturization of semiconductor devices. Also, owing to poor control of the thickness of the adhesive layer 14, a short circuit may arise if the second semiconductor chip 12b comes into contact with the first bonding wires 13a, or when the first bonding wire 13a comes into contact with the second bonding wires 13b.

Owing to circuit integration, it is becoming more common to embed a semiconductor component in a carrier board. Referring to FIG. 2, which is a schematic view showing a conventional circuit board structure with a semiconductor component embedded therein. As shown in drawing, at least one cavity 200 is formed in a carrier board 20 and configured to receive a semiconductor component 21. The semiconductor component 21 has an active surface 21a formed with a plurality of electrode pads 212. A dielectric layer 22 is applied over the carrier board 20 and the active surface 21a. Formed on the dielectric layer 22 is a circuit layer 23 having a plurality of conductive structures 231 for electrical connection with the electrode pads 212. In doing so, a plurality of circuit layers are built up so as to form a multilayer circuit board.

Nevertheless, as regards the aforesaid process, since a single carrier board 20 embedded with a semiconductor component 21 has very limited electronic functions, it is necessary to use more than one semiconductor component 21 in order to enhance the electrical functions of the carrier board 20, which in turn entails forming a plurality of cavities 200 in the carrier board 20. However, a problem arises that the area of the carrier board 20 is very limited and not to be increased, thus limiting the increase and development of the electrical functions of the carrier board 20.

Accordingly, an issue which needs an efficient solution is related to an attempt to embed a semiconductor component in a circuit board and enhance the electrical functions thereof.

SUMMARY OF THE INVENTION

In light of the aforesaid drawbacks of the prior art, it is a primary objective of the present invention to provide a stack structure of circuit boards with semiconductor components embedded therein that is capable of simplifying a manufacturing process and reducing costs.

Another objective of the present invention is to provide a stack structure of circuit boards with semiconductor components embedded therein that is capable of enhancing the electrical function of the stack structure.

Yet another objective of the present invention is to provide a stack structure of circuit boards with semiconductor components embedded therein that is capable of shortening the manufacturing process and thereby facilitate the mass production thereof.

In order to achieve the above and other objectives, the present invention provides a stack structure of circuit boards with semiconductor components embedded therein. The circuit board stack structure comprises at least two circuit boards, a plurality of conductive bumps, and at least one adhesive layer. The circuit boards each comprise a first circuit layer and a cavity respectively. The cavity is used to receive a semiconductor component having a plurality of electrode pads formed thereon. The first circuit layer comprises a plurality of first electrical connection pads and a plurality of first conductive members for keeping electrically connected to the electrode pads. The conductive bumps are formed on the first electrical connection pads of at least one of the circuit boards. The adhesive layer is interposed between the circuit boards to allow a conductive channel to be formed by a portion of the adhesive layer positioned between the conductive bumps of one of the at least two circuit boards and the first electrical connection pads of another one of the at least two circuit boards corresponding thereto, such that an electrical connection between the circuit boards is formed.

In another embodiment of the present invention, the conductive bumps are formed on the first electrical connection pads, whereby a conductive channel is formed by a portion of the adhesive layer positioned between the opposing conductive bumps, such that an electrical connection between the circuit boards is formed.

The circuit boards are either one of a printed circuit board or an IC package substrate. The adhesive layer is made of an anisotropic conductive adhesive comprising an adhesive resin, a hardening agent, and conductive particles. The adhesive layer interposed between the circuit boards are heated to soften the adhesive resin in the adhesive layer, such that the conductive particles drift to the first electrical connection pads and the surfaces of the conductive bumps and are solidified by the hardening agent during a cooling process. Then, the conductive particles are aggregated and retained in position at sites (compression sites) between the conductive bumps and the first electrical connection pads corresponding thereto, or at sites (compression sites) between the opposing conductive bumps, so as to form a conductive channel for electrically connecting the two stacked circuit boards.

An insulating protective layer is formed on an adhesive-layer-free surface of each of the circuit boards. The insulating protective layer is further formed with a plurality of openings for exposing the first electrical connection pads.

Alternatively, a circuit build up structure is formed on an adhesive-layer-free surface of each of the circuit boards. The circuit build up structure has a plurality of second conductive members for electrical connecting the first circuit layer and a plurality of second electrical connection pads disposed thereon. The circuit build up structure is covered by an insulating protective layer formed with a plurality of openings for exposing the second electrical connection pads.

With regard to the two circuit boards, one circuit board has a plurality of conductive bumps formed on the electrical connection pads on one side of the circuit board but the electrical connection pads on the other side of the circuit board are free of any conductive bumps. The conductive bumps of the circuit boards are aligned in position with the electrical connection pads of the other circuit board. Then, an adhesive layer is interposed between the two circuit boards. Accordingly, a stack structure of circuit boards with semiconductor components embedded therein is completed by a laminating process, using a plurality of semiconductor components and circuits, so as to enhance the electrical function of the whole structure, simplify the manufacturing process, and reduce costs. A plurality of circuit boards are fabricated first, and a laminating process is then performed to shorten the manufacturing process of multilayer circuit boards and thereby facilitate the mass production thereof.

BRIEF DESCRIPTION OF THE DRAWINGS

FIG. 3B' is another assembled cross-sectional view showing a stack structure of circuit boards with semiconductor components embedded therein in accordance with the present invention;

DETAILED DESCRIPTION OF THE PREFERRED EMBODIMENTS

The following specific embodiments are provided to illustrate the present invention. Others skilled in the art can readily gain an insight into other advantages and features of the present invention based on the contents disclosed in this specification.

First Embodiment

Figure 1:
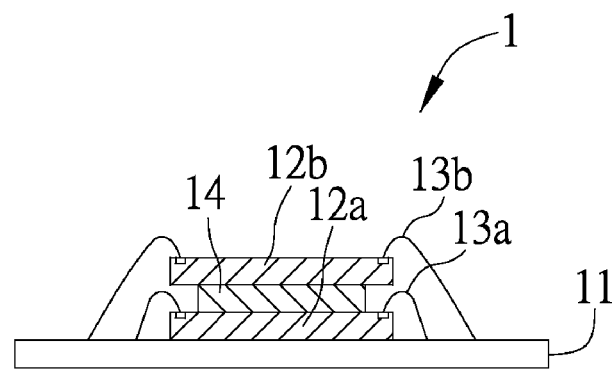
FIG. 1 (PRIOR ART) is a cross-sectional view showing a multi-chip semiconductor package disclosed in U.S. Pat. No. 5,323,060.
Figure 2:
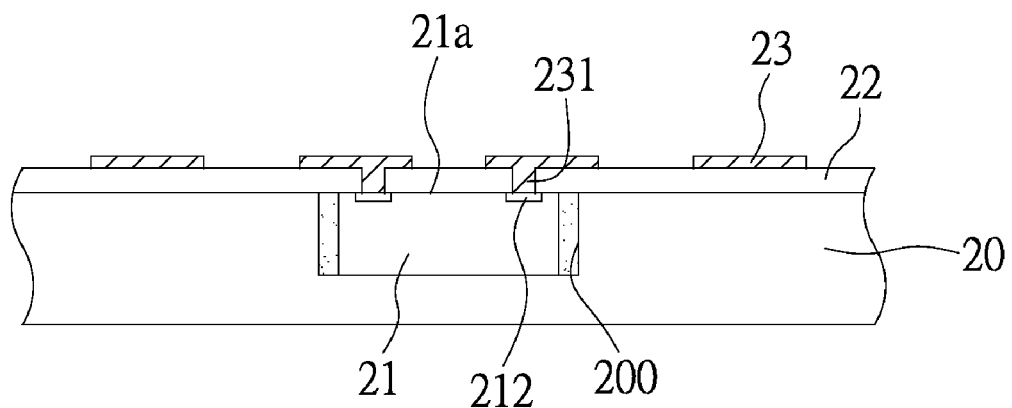
FIG. 2 (PRIOR ART) is a schematic view showing a conventional circuit board structure with semiconductor components embedded therein.
Figure 3A:
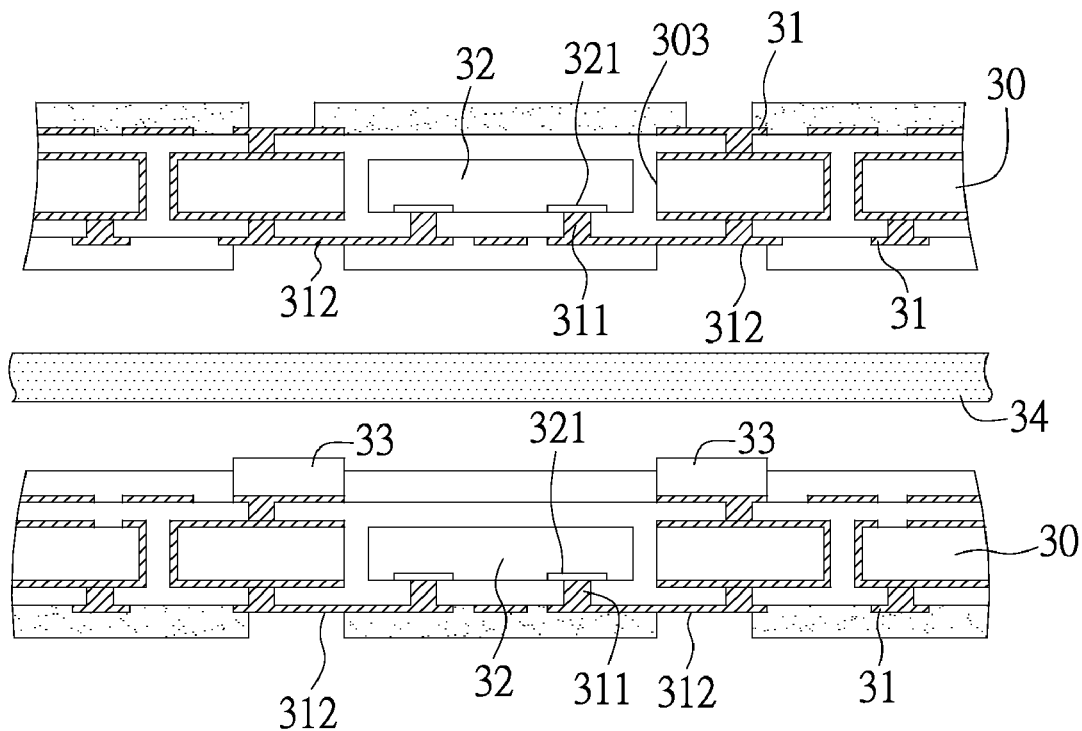
FIGS. 3A and 3B are each an exploded cross-sectional view and an assembled cross-sectional view showing a stack structure of circuit boards having semiconductor components embedded therein according to a first embodiment of the present invention.
Figure 3B:
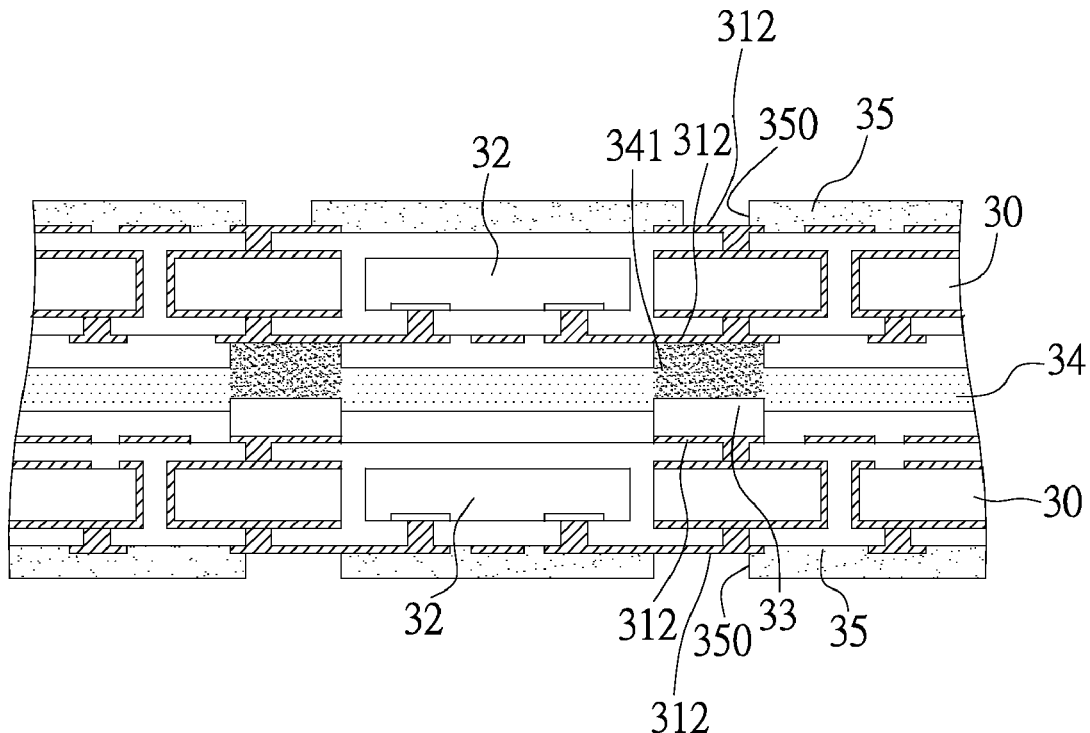
Figure 3B:
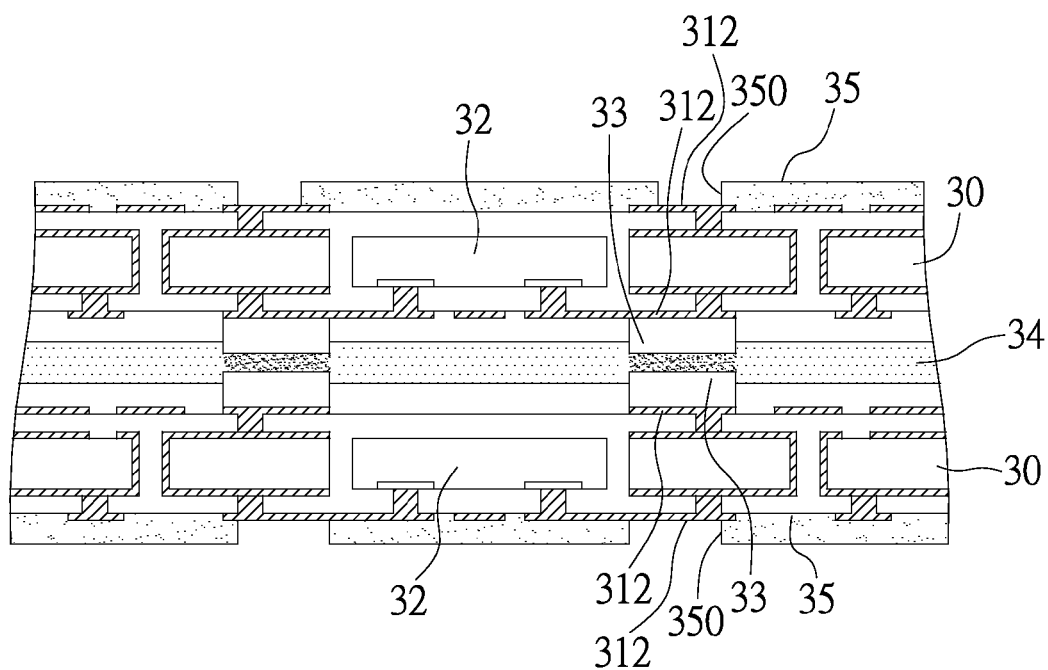

Referring to FIGS. 3A and 3B, a stack structure of circuit boards with semiconductor components embedded therein according to the first embodiment of the present invention is shown, the structure being comprised of at least two circuit boards 30 exemplified either in the form of printed circuit boards or IC package substrates. The circuit boards 30 each have a first circuit layer 31 disposed thereon and comprise at least one cavity 303 therein. The cavity 303 is used to receive at least one semiconductor component 32 therein. The semiconductor component 32 is made of a material selected from the group consisting of an active component and a passive component. The active component is one selected from the group consisting of a CPU and a memory (DRAM, SRAM, and SDRAM). The passive component is one selected from the group consisting of a capacitor, a resistor, and an inductor. The semiconductor component 32 has a plurality of electrode pads 321 formed thereon. The first circuit layer 31 has a plurality of first conductive members 311 for electrically connecting the electrode pads 321 of the semiconductor component 32. The first circuit layer 31 has a plurality of second electrical connection pads 312. The second electrical connection pads 312 of at least one of the two circuit boards 30 have conductive bumps 33 disposed thereon. The conductive bumps 33 is one selected from the group consisting of copper (Cu), silver (Ag), gold (Au), nickel-gold (Ni—Au), and nickel-lead-gold (Ni—Pb—Au). As shown in FIG. 3A, at least one adhesive layer 34 is interposed between at least two circuit boards 30, allowing a conductive channel to be formed by a portion of the adhesive layer 34 interposed between the conductive bumps 33 and the first electrical connection pads 312 and to thereby electrically connect the two circuit boards 30 as shown FIG. 3B.

The adhesive layer 34 is made of an anisotropic conductive adhesive comprising an adhesive resin, a hardening agent, and conductive particles 341. The adhesive layer 34 interposed between the circuit boards 30 are heated to soften the adhesive resin in the adhesive layer 34, such that the conductive particles 341 drift to the surfaces of the first electrical connection pads 312 and the surfaces of the conductive bumps 33 and are solidified by a hardening agent during a cooling process. Then, the conductive particles 341 are aggregated and retained in position at sites (compression sites) between the conductive bumps 33 of one of the two circuit boards 30 and the first electrical connection pads 312 of another one of the two circuit boards 30 corresponding thereto as shown in FIG. 3B. Alternatively, with the conductive bumps 33 being formed on the first electrical connection pads 312 of the two circuit boards 30, in a laminating process a conductive channel is formed by a portion of the adhesive layer 34 at positions (compression positions) between the opposing conductive bumps 33 when the conductive particles 341 aggregate between the opposing conductive bumps 33. as shown in FIG. 3B'.

An insulating protective layer 35 is further formed on an adhesive-layer-free surface of each of the circuit boards 30 and formed with a plurality of openings 350 for exposing the first electrical connection pads 312. Further formed on the first electrical connection pads 312 are solder balls 311 (not shown) for electrically connecting the semiconductor components with an external electronic device.

Second Embodiment

Figure 4:
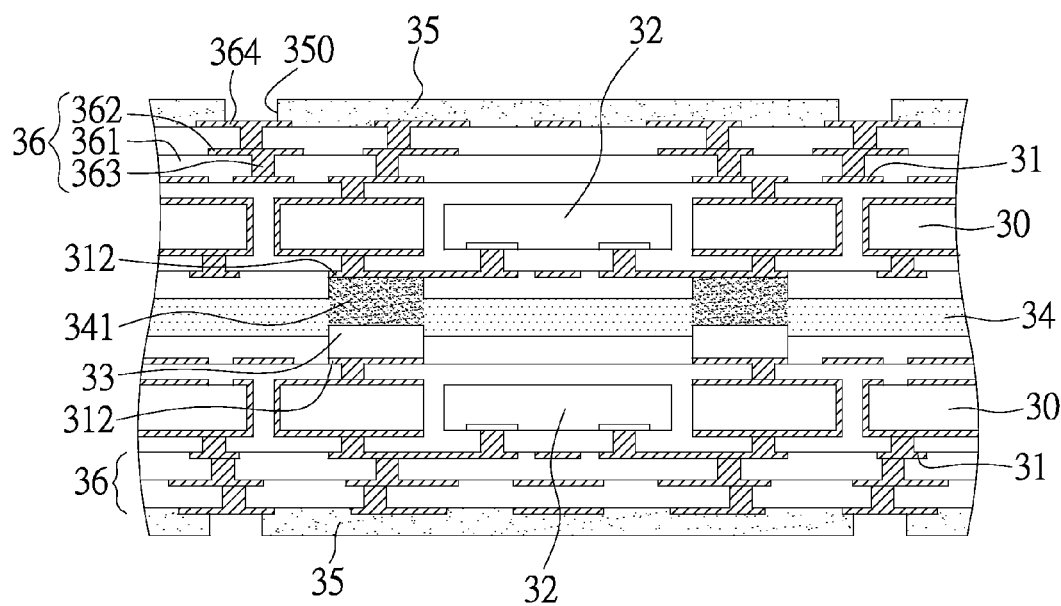
FIG. 4 is a cross-sectional view showing a stack structure of circuit boards with semiconductor components embedded therein according to a second embodiment of the present invention.

Referring to FIG. 4, a stack structure of circuit boards with semiconductor components embedded therein according to the second embodiment of the present invention is shown. The second embodiment differs from the first embodiment in that a circuit build up structure 36 is formed on an adhesive-layer-free surface of the circuit boards 30. The circuit build up structure 36 is comprised of a dielectric layer 361, a second circuit layer 362 formed on the dielectric layer 361, and second conductive members 363 formed in the dielectric layer 361. The second conductive members 363 electrically connect with the first circuit layer 31. The circuit build up structure 36 has second electrical connection pads 364 formed thereon and is covered by an insulating protective layer 35. The insulating protective layer 35 is formed with a plurality of openings 350 for exposing the second electrical connection pads 364. Further formed on the second electrical connection pads 364 are other conductive members 363 (not shown) for electrically connecting to an external electronic device. As the circuit build up structure 36 is formed on both the external sides of the two stacked up circuit boards 30, a structure of multilayer circuit boards can be formed.

Third Embodiment

Figure 5:
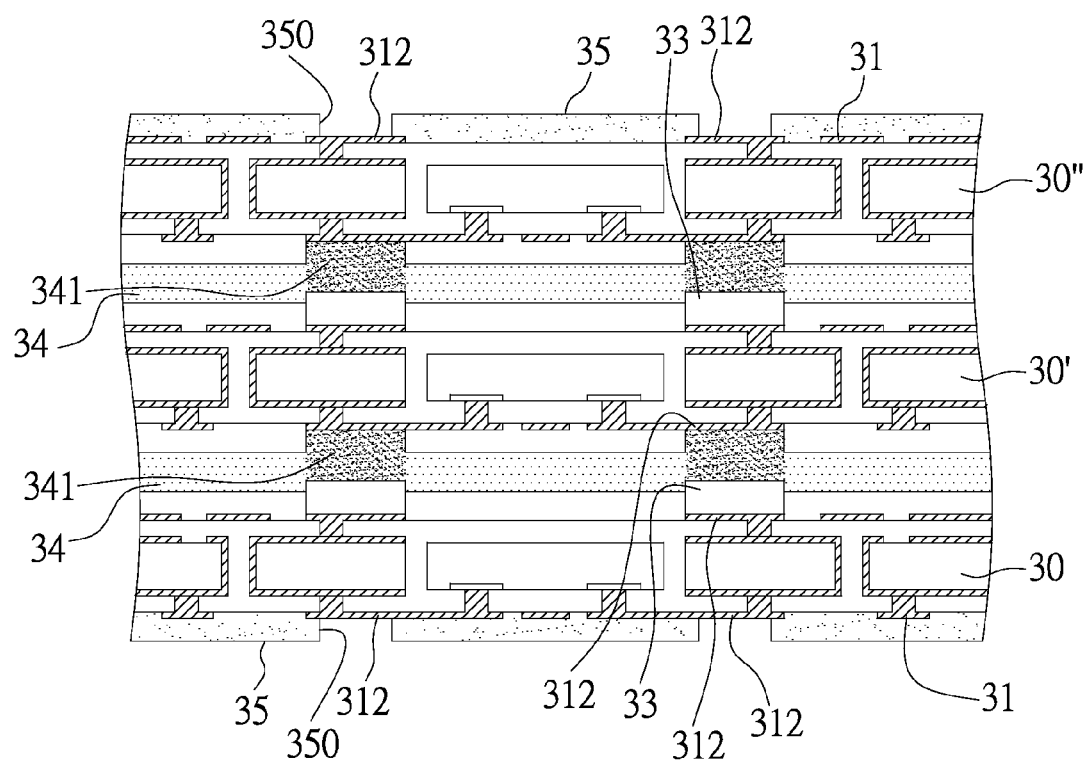
FIG. 5 is a cross-sectional view showing a stack structure of circuit boards with semiconductor components embedded therein according to a third embodiment of the present invention.

Referring to FIG. 5, a stack structure of circuit boards with semiconductor components embedded therein according to the third embodiment of the present invention is shown. The third embodiment differs from the second embodiment in that the circuit boards are stacked up repeatedly via the adhesive layer to build a stack structure of multilayer circuit boards. The stack structure of circuit boards of the third embodiment has the following features. One circuit board 30 has conductive bumps 33 formed on first electrical connection pads 312 on one side of the circuit board 30 but the electrical connection pads formed on the other side of the circuit board 30 are exposed and thereby are free of any conductive bumps 33. The conductive bumps 33 on the first electrical connection pads 312 formed on the one side of the circuit board 30 are brought close to the first electrical connection pads 312 of the other circuit board 30'. Then, an adhesive layer 34 is disposed between the two circuit boards 30 and 30'. Afterward, a second adhesive layer 34 is disposed on the circuit board 30' to hold yet another circuit board 30". Similarly, the resultant structure can be used to build up a multilayer circuit board structure.

The first circuit layer 31 disposed on the external sides of the circuit boards 30 and 30" is covered by an insulating protective layer 35. The insulating protective layer 35 comprises a plurality of openings 350 for exposing the first electrical connection pads 312. Further formed on the first electrical connection pads 312 are other conductive structures, such as solder balls (not shown), for electrically connecting with an external electronic device.

Accordingly, the stack structure of circuit boards with semiconductor components embedded therein in accordance with the present invention has an electrical connection between a conductive bump formed on an electrical connection pad of at least one of the two circuit boards and another electrical connection pad or another conductive bump of another one of the two circuit boards 30. At least two circuit boards are each embedded with semiconductor components beforehand, and then an adhesive layer is interposed between the circuit boards. The adhesive layer is made of an anisotropic conductive adhesive comprising an adhesive resin, a hardening agent, and conductive particles. Once the adhesive layer interposed between the circuit boards is heated, the conductive particles in the adhesive layer will aggregate between the electrical connection pad and the conductive bump of the circuit boards, or between the conductive bumps of the circuit boards, so as to form a conductive channel and thereby electrically connect the stacked circuit boards and the semiconductor components embedded therein, thus simplifying the manufacturing process and enhancing the electrical performance of the stack structure. In addition, a plurality of circuit boards are fabricated first, and a circuit board stack structure is then formed by a laminating process to shorten the manufacturing process of multilayer circuit boards and thereby facilitate the mass production thereof.

The aforesaid embodiments merely serve as the preferred embodiments of the present invention. They should not be construed as to limit the scope of the present invention in any way. Hence, any other changes can actually be made in the present invention. It will be apparent to those skilled in the art that all equivalent modifications or changes made, without departing from the spirit and the technical concepts disclosed by the present invention, should fall within the scope of the appended claims.

What is claimed is:

1. A stack structure of circuit boards with semiconductor components embedded therein, comprising:
    at least two circuit boards each having a first circuit layer formed thereon and a cavity formed therein, wherein the cavity is used to receive a semiconductor component having a plurality of electrode pads, and the first circuit layer is formed with a plurality of first electrical connection pads and a plurality of first conductive vias for electrically connecting the electrode pads of the semiconductor component and the first electrical connection pads of the first circuit layer, wherein one end of each of the first conductive vias is directly connected to corresponding one of the first electrical connection pads, and the other end of the each of the first conductive vias is directly connected to corresponding one of the electrode pads;
    a plurality of conductive bumps formed on the first electrical connection pads of at least one of the circuit boards; and
    at least an adhesive layer interposed between the circuit boards, allowing a conductive channel to be formed by a portion of the adhesive layer positioned between the conductive bumps of one of the at least two circuit boards and the first electrical connection pads of another one of the at least two circuit boards corresponding thereto, such that an electrical connection between the circuit boards is formed, wherein the adhesive layer is an anisotropic conductive adhesive comprising an adhesive resin, a hardening agent, and conductive particles.

2. The stack structure of circuit boards with semiconductor components embedded therein of claim 1, wherein the semiconductor component is one of an active component and a passive component.

3. The stack structure of circuit boards with semiconductor components embedded therein of claim 1, wherein the circuit boards are either one of a printed circuit board or an IC package substrate.

4. The stack structure of circuit boards with semiconductor components embedded therein of claim 1, further comprising an insulating protective layer formed on an adhesive-layerfree surface of each one of the circuit boards and formed with a plurality of openings for exposing the first electrical connection pads.

5. The stack structure of circuit boards with semiconductor components embedded therein of claim 1, further comprising a circuit build up structure formed on an adhesive-layer-free surface of each of the circuit boards and formed with a plurality of second electrical connection pads and a plurality of second conductive vias for electrically connecting with the first circuit layer.

6. The stack structure of circuit boards with semiconductor components embedded therein of claim 5, further comprising an insulating protective layer formed on the circuit build up structure and formed with a plurality of openings for exposing the second electrical connection pads.

7. The stack structure of circuit boards with semiconductor components embedded therein of claim 5, wherein the circuit build up structure further comprises a dielectric layer and a second circuit layer formed on the dielectric layer on which the plurality of second conductive vias are formed.

8. The stack structure of circuit boards with semiconductor components embedded therein of claim 1, wherein the conductive bumps are made of a metallic material selected from the group consisting of copper, silver, gold, nickel-gold, and nickel-lead-gold.

9. A stack structure of circuit boards with semiconductor components embedded therein, comprising:
   at least two circuit boards each having a first circuit layer formed thereon and a cavity disposed therein, wherein the cavity is used to receive a semiconductor component having a plurality of electrode pads, and the first circuit layer is formed with a plurality of first electrical connection pads and a plurality of first conductive vias for electrically connecting the electrode pads of the semiconductor component and the first electrical connection pads of the first circuit layer, wherein one end of each of the first conductive vias is directly connected to corresponding one of the first electrical connection pads, and the other end of the each of the first conductive vias is directly connected to corresponding one of the electrode pads;
   a plurality of conductive bumps formed on the first electrical connection pads of the circuit boards; and
   at least an adhesive layer interposed between the circuit boards, allowing a conductive channel to be formed by a portion of the adhesive layer positioned between the opposing conductive bumps formed on each of the at least two circuit boards such that an electrical connection between the circuit boards is formed, wherein the adhesive layer is an anisotropic conductive adhesive comprising an adhesive resin, a hardening agent, and conductive particles.

10. The stack structure of circuit boards with semiconductor components embedded therein of claim 9, wherein the semiconductor component is one of an active component and a passive component.

11. The stack structure of circuit boards with semiconductor components embedded therein of claim 9, wherein the circuit boards are either one of a printed circuit board or an IC package substrate.

12. The stack structure of circuit boards with semiconductor components embedded therein of claim 9, further comprising an insulating protective layer formed on an adhesive-layer-free surface of each of the circuit boards and formed with a plurality of openings for exposing the first electrical connection pads.

13. The stack structure of circuit boards with semiconductor components embedded therein of claim 9, further comprising a circuit build up structure formed on an adhesive-layer-free surface of each of the circuit boards and formed with a plurality of second electrical connection pads and a plurality of second conductive vias for electrically connecting the first circuit layer.

14. The stack structure of circuit boards with semiconductor components embedded therein of claim 13, further comprising an insulating protective layer formed on the circuit build up structure and formed with a plurality of openings for exposing the second electrical connection pads.

15. The stack structure of circuit boards with semiconductor components embedded therein of claim 13, wherein the circuit build up structure further comprises a dielectric layer on which the second conductive vias are formed and a second circuit layer formed on the dielectric layer.

16. The stack structure of circuit boards with semiconductor components embedded therein of claim 9, wherein the conductive bumps is made of a metallic material selected from the group consisting of copper, silver, gold, nickel-gold, and nickel-lead-gold.

* * * * *